United States Patent
Domingues Dos Santos et al.

(10) Patent No.: US 12,376,494 B2
(45) Date of Patent: Jul. 29, 2025

(54) POLYMER FORMULATION FOR COATING A METAL CORE

(71) Applicant: Arkema France, Colombes (FR)

(72) Inventors: Fabrice Domingues Dos Santos, Colombes (FR); Simon Jestin, Pessac (FR)

(73) Assignee: ARKEMA FRANCE, Puteaux (FR)

( * ) Notice: Subject to any disclaimer, the term of this patent is extended or adjusted under 35 U.S.C. 154(b) by 715 days.

(21) Appl. No.: 17/416,228

(22) PCT Filed: Dec. 11, 2019

(86) PCT No.: PCT/FR2019/053008
§ 371 (c)(1),
(2) Date: Jun. 18, 2021

(87) PCT Pub. No.: WO2020/128230
PCT Pub. Date: Jun. 25, 2020

(65) Prior Publication Data
US 2022/0077378 A1 Mar. 10, 2022

(30) Foreign Application Priority Data
Dec. 20, 2018 (FR) ...................................... 1873569

(51) Int. Cl.
*H10N 30/00* (2023.01)
*C09D 7/20* (2018.01)
(Continued)

(52) U.S. Cl.
CPC ............. *H10N 30/702* (2024.05); *C09D 7/20* (2018.01); *C09D 7/45* (2018.01); *C09D 7/63* (2018.01);
(Continued)

(58) Field of Classification Search
CPC ....... C08K 5/544; C08L 33/06; C09D 127/16; C09D 7/20; C09D 7/45
See application file for complete search history.

(56) References Cited

U.S. PATENT DOCUMENTS

| 4,497,849 A | 2/1985 | Hughes et al. |
| 2009/0047445 A1 | 2/2009 | Schneider et al. |

(Continued)

FOREIGN PATENT DOCUMENTS

| CN | 1367929 A | 9/2002 |
| CN | 102292356 A | 12/2011 |

(Continued)

OTHER PUBLICATIONS

Chen et al., "Polymeric piezoelectric fiber with metal core produced by electrowetting—aided dry spinning method" J. Appl. Polym. Sci., vol. 133, 2016 , pp. 1-8.
(Continued)

*Primary Examiner* — Minh N Trinh
(74) *Attorney, Agent, or Firm* — Boone IP Law

(57) ABSTRACT

Multicomponent fibers with a piezoelectric effect, including an electroactive fluoropolymer shell which adheres to a metal core. Also, a solvent-based fluoropolymer formulation which makes it possible to obtain optimum adhesion to a bare, electrically conductive metal filament. Also, a process for manufacturing these composite fibers, and also their uses in varied sectors of technical textiles, filtration and in electronics.

9 Claims, 3 Drawing Sheets

(51) Int. Cl.
  *C09D 7/45* (2018.01)
  *C09D 7/63* (2018.01)
  *C09D 7/65* (2018.01)
  *C09D 127/16* (2006.01)
  *H10N 30/045* (2023.01)
  *H10N 30/098* (2023.01)
  *H10N 30/857* (2023.01)

(52) U.S. Cl.
  CPC .............. *C09D 7/65* (2018.01); *C09D 127/16* (2013.01); *H10N 30/045* (2023.02); *H10N 30/098* (2023.02); *H10N 30/857* (2023.02)

(56) References Cited

U.S. PATENT DOCUMENTS

| | | |
|---|---|---|
| 2011/0209897 A1 | 9/2011 | Denton et al. |
| 2013/0153814 A1 | 6/2013 | Bauer et al. |
| 2017/0253760 A1 | 9/2017 | Zheng et al. |
| 2019/0109274 A1 | 4/2019 | Ogasahara et al. |
| 2022/0077378 A1* | 3/2022 | Domingues Dos Santos ............. H10N 30/045 |

FOREIGN PATENT DOCUMENTS

| | | |
|---|---|---|
| CN | 104790064 A | 7/2015 |
| CN | 106661180 A | 5/2017 |
| CN | 207707962 U | 8/2018 |
| JP | 04-011792 A | 1/1992 |
| JP | 2014-501792 A | 1/2014 |
| JP | 2017-183570 A | 10/2017 |
| KR | 10-2017-0079516 A | 7/2017 |
| KR | 20170079519 A | 7/2017 |
| WO | 00/74075 A1 | 12/2000 |
| WO | 2009083416 A1 | 7/2009 |
| WO | 2014/161920 A1 | 10/2014 |
| WO | 2018224583 A1 | 12/2018 |

OTHER PUBLICATIONS

Ico et al., "Size-dependent piezoelectric and mechanical properties of electrospun P(VDF-TrFE) nanofibers for enhanced energy harvesting" Journal of Materials Chemistry A, vol. 4, No. 6, 2016, pp. 2293-2304.

Office Action received for Chinese Patent Application No. 201980089148.8, mailed on Sep. 23, 2023, 16 pages (10 pages of English Translation and 6 pages of Original Document).

Office Action received for Japanese Patent Application No. 2021-535695, mailed on Dec. 5, 2023, 16 pages (7 pages of English Translation and 9 pages of Original Document).

International Search Report (PCT/ISA/210) and Written Opinion (PCT/ISA/237) mailed on Mar. 23, 2020, by the French Patent Office as the International Searching Authority for International Application No. PCT/FR2019/053008.

* cited by examiner

[Figure 1]
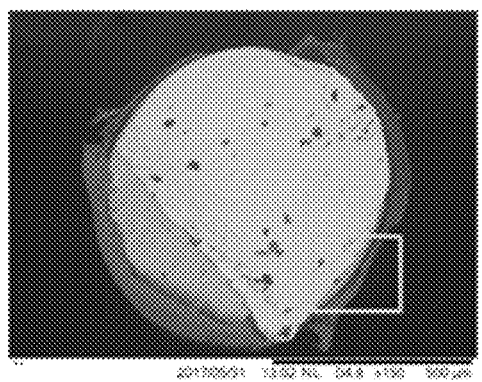
a
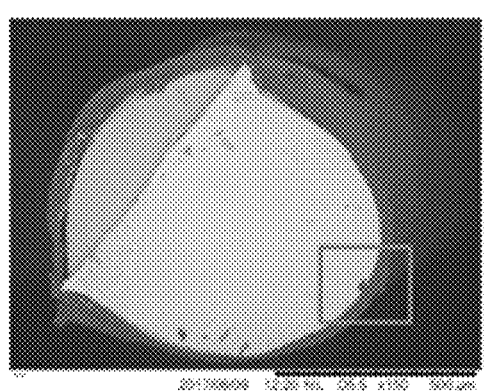
b
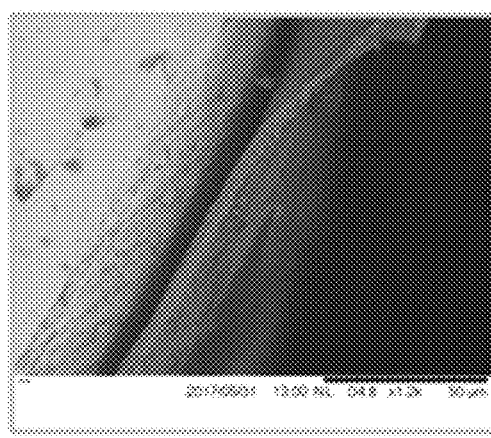
c
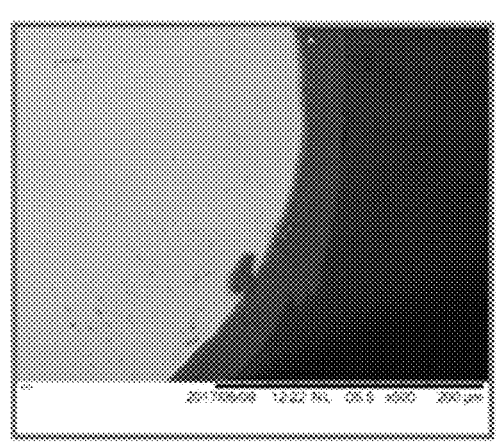
d

[Figure 2]
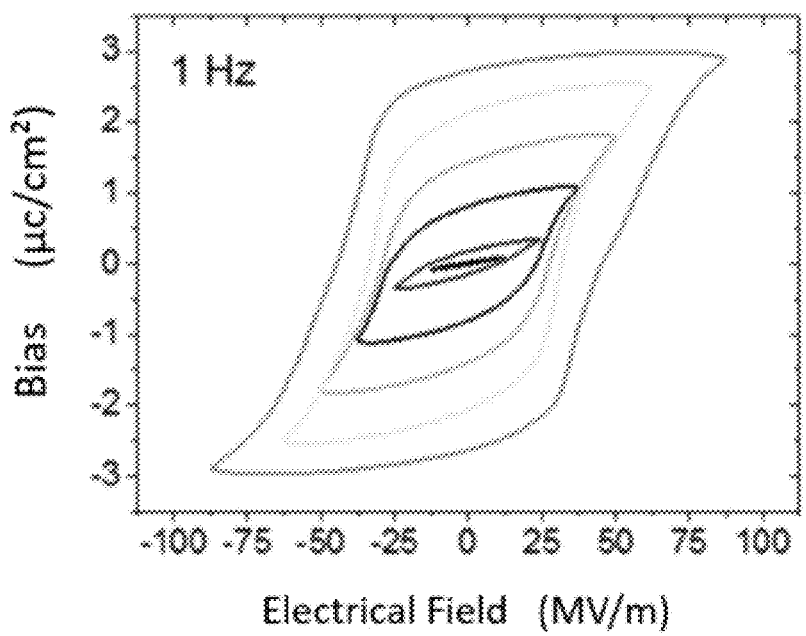
[Figure 3]
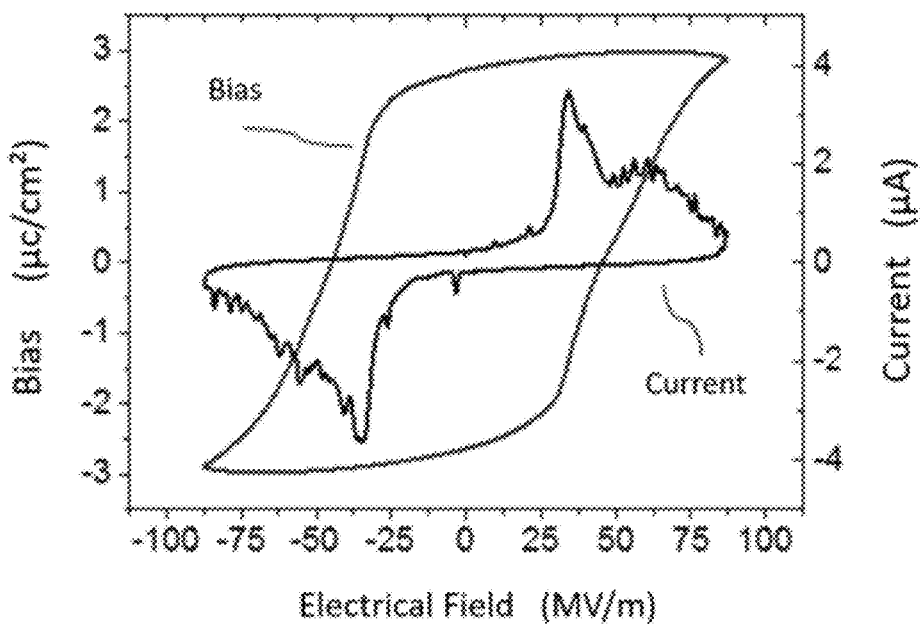

[Figure 4]
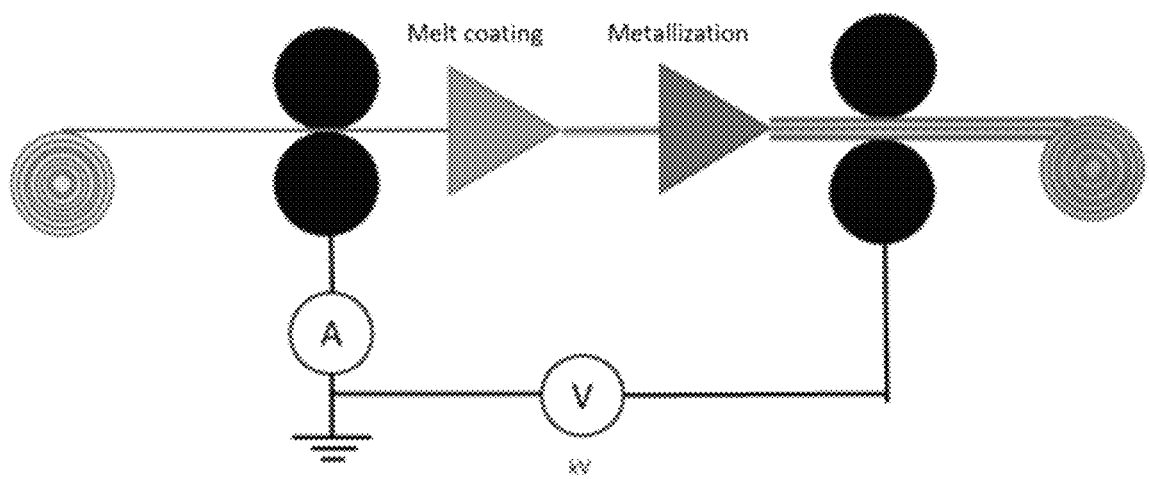

POLYMER FORMULATION FOR COATING A METAL CORE

FIELD OF THE INVENTION

The present invention relates to the field of composite piezoelectric fibers. More particularly, the invention relates to multicomponent fibers with a piezoelectric effect, comprising an electroactive fluoropolymer shell which adheres to a metal core. The invention also relates to a solvent-based fluoropolymer formulation which makes it possible to obtain optimum adhesion to a bare, electrically conductive metal filament. The invention also relates to the process for manufacturing these composite fibers, and also to their uses in varied sectors of technical textiles, composite materials, filtration and in electronics.

TECHNICAL BACKGROUND

Ferroelectric and relaxor ferroelectric materials which generate a mechanical action induced by an external electric field have drawn much attention and have been acknowledged for applications in various transducers, actuators and sensors.

Among the piezoelectric materials, ceramics are the materials most commonly used on account of their good actuating properties and of their very broad bandwidth. They have, however, a fragility which prevents them from being applied onto curved or complex surfaces.

Other electrically conductive devices use polymer films sandwiched between two electrodes. Among the polymers that may be used, fluoropolymers based notably on vinylidene fluoride (VDF) represent a class of compounds with remarkable properties for a large number of applications. Polyvinylidene fluoride (PVDF) and copolymers comprising VDF and trifluoroethylene (TrFE) are particularly interesting owing to their piezoelectric properties.

These flexible piezoelectric structures are only available commercially in the form of films. However, certain applications require the availability of polymeric piezoelectric fibers, which can be implanted directly into certain materials to form "smart" materials.

Such fibers have been manufactured in the laboratory in monocomponent or multicomponent form.

Multicomponent spinning of conductive polymers and piezoactive polymers simultaneously allows the production of a 100% polymer multilayer fiber. Such a fiber has been described, for example, by the Applicant in patent application WO 2018/224583 which concerns a piezoelectric polymer fiber consisting of three different polymer layers: a layer consisting of at least one fluoropolymer, a layer comprising at least one polyolefin and a polyamide layer.

In general, the conductive polymers used as electrodes must meet the following criteria: be able to be used by extrusion; be sufficiently fluid to be used in a spinning process; have spinning temperatures close to the constituent piezoelectric material of the fiber, and be sufficiently electrically conductive to ensure biasing of the fiber and efficient recovery of the charges generated during the deformation of the piezoelectric material.

To meet all of these criteria, the use of conductive polymer compounds (abbreviated as CPC) is generally favored. However, polymers that are intrinsically conductive such as: polyaniline; the mixture PEDOT:PSS where PEDOT denotes poly(3,4-ethylenedioxythiophene) and PSS denotes poly(styrene sulfonate); or polypyrrole, cannot be used in a melt route. A person skilled in the art will thus make CPCs using spinning-grade polymers such as: polyamide (PA), polyethylene (PE), poly(ethylene oxide) (PEO) or poly(ethylene terephthalate) (PET), combining them with electrically conductive fillers such as carbon blacks, carbon nanotubes, graphenes, silver nanowires or metal nanowires, gold nanoparticles or the like.

Although the electrical conductivity of CPC granules is generally acceptable (for example up to 1000 S/m), this value decreases greatly when the material is used in filament form, by a factor of $10^3$ or even $10^6$ in certain cases. This phenomenon is mainly due to the alignment of the conductive fillers during the spinning process, which induces a decrease in the electrical percolation of these fillers and thus in the overall conductivity of the CPC filament.

To solve this problem, the use of a metal core (for example made of stainless steel), coated with a piezoactive polymer provided by extrusion, this technique being known as melt coating, has been proposed. This technique proves to be difficult to implement in practice. It requires a piezoactive polymer with a low melt viscosity and leads to substantial coating thicknesses, greater than 100 µm. Another problem lies in the centering of the metal core in the polymer coat, this problem being all the more difficult to control the smaller the desired thickness.

In the case of piezoelectric fibers, polymer layer thicknesses of less than 50 µm are desired in order to obtain a linear piezoelectric response in deformation by overcoming the viscoelastic behavior of the PVDF type polymer. Moreover an excessive polymer thickness necessitates the application of high bias voltages, which may be problematic since they cause air breakdown or require sophisticated apparatus.

The use of a solvent-based coating process makes it possible to overcome these viscosity problems and to obtain fluoropolymer layers of lower thickness, typically between 1 and 30 µm. The main challenge of this technique lies in the production of an adhesive polymer layer at the surface of the metal wire, particularly when a fluoropolymer is used.

The publication by Liu, W., Chen, R., Ruan, X. and Fu, X. "*Polymeric piezoelectric fiber with metal core produced by electrowetting-aided dry spinning method.*" J. Appl. Polym. Sci. 133, n/a-n/a (2016) describes the electrowetting-aided solvent-based coating of PVDF or of P(VDF-TrFE) copolymer on a metal core. A copper wire 100 µm in diameter enamelled with polyester-imide (6 µm thick) is used as central core. A PVDF in powder form (Mw=5 340 000) and a P(VDF-TrFE) (VDF/TrFE mass ratio: 70/30) copolymer are dissolved in a 1/1 dimethylformamide/acetone mixture in a concentration of 10, 15 and 20 w %. The enamelled wire passes through a solution of polymer and through a copper needle 1 mm in diameter and then through a series of concentric electrodes of 3.5 mm to 0.5 mm. The coating nozzle is biased at 1 kV. The copper core stripped of its enameling is earthed and the electrodes are connected to a continuous high voltage of 4 kV. The applied field is less than 20 MV/m. Crystallization of the polymer takes place by solvent evaporation. The fiber obtained is metallized with gold by cathode sputtering. The authors show that the use of the electrowetting process makes it possible to obtain polymer layers on copper that are more homogeneous, smoother and more adhesive than without high voltage. The layers using 15% P(VDF-TrFE) are more homogeneous than the PVDF layers. The beta phase is obtained when the electric field is applied. Coat thicknesses of between 3 and 8 µm are obtained with the majority of the solutions used. The thickness homogeneity is improved by using high voltage. This process nevertheless remains complicated to use and involves high electrical voltages during the manufacture.

Furthermore, no proof of adhesion of the fluoropolymer to the enamelled wire has been provided, for instance a microscopy image of the section of the filaments obtained.

There is thus a need to develop a fluoropolymer-based coating formulation which makes it possible to obtain optimum adhesion to a bare electrically conductive metal filament, by means of a simple solvent-based process for the continuous coating of filament with a piezoelectric polymer, without prior enameling or cladding. The invention is also directed toward providing multicomponent fibers with a piezoelectric effect, comprising an electroactive fluoropolymer shell which adheres to a metal core.

SUMMARY OF THE INVENTION

The invention relates firstly to a polymer formulation for coating a metal core, comprising the following components:
   a) a P(VDF-TrFE) copolymer solution at 10-30% by mass in a volatile solvent,
   b) a surfactant, and
   c) an adhesion promoter.

According to one embodiment, the P(VDF-TrFE) copolymer consists of units derived from VDF and from TrFE, the proportion of units derived from TrFE ranging from 5 mol % to 95 mol % relative to the sum of the units derived from VDF and from TrFE.

According to one embodiment, said volatile solvent is chosen from the following list:
   ketones, notably methyl isobutyl ketone, methyl ethyl ketone (MEK), cyclopentanone and acetone,
   esters, notably ethyl acetate, methyl acetate, propyl acetate, butyl acetate and propylene glycol methyl ether acetate,
   amides such as dimethylformamide and dimethylacetamide,
   dimethyl sulfoxide,
   furans, notably tetrahydrofuran,
   carbonates, notably dimethyl carbonate,
   phosphates, notably triethyl phosphate,
   and mixtures thereof.

The surfactant ensures optimum wetting of the solution of fluoro copolymer on the metal core. According to one embodiment, said surfactant is of the nonionic type, preferably based on acrylic copolymers.

The adhesion promoter contributes toward improving the wetting of the solution of fluoro copolymer on the metal core, and also makes it possible to obtain an adhesive coating of copolymer on the filament. It is a polymer functionalized with groups such as —NH$_2$, —OH, —COOH or other associative groups.

According to one embodiment, said adhesion promoter comprises functional copolymers of hydroxyl type with acid groups or binders of ethoxysilane type.

According to one embodiment, the viscosity of the coating formulation is between 1 and 500 Pa·s for a shear rate of 10 s$^{-1}$. Preferentially, the viscosity of the coating solution is between 10 and 100 Pa·s. Finally, a solution which shows shear-thickening behavior is advantageous.

The invention also relates to a solvent-based process for the continuous manufacture of a composite piezoelectric fiber comprising a metal filament covered with a layer of piezoelectric fluoropolymer, said process comprising the following steps:
   i) providing a bare metal wire,
   ii) coating said metal wire with the coating formulation according to the invention, comprising the passage of said metal wire through a coating nozzle where said coating formulation is injected, to obtain a coated metal wire,
   iii) drying said coated metal wire to evaporate the solvent,
   iv) heating the dried coated metal film to achieve thermal annealing.

The process also comprises a step v) of winding the coated metal wire, which may be performed either before the thermal annealing step or after this step.

The metal wire acts as an inner electrode. Various uses of this composite piezoelectric wire require the deposition of an outer electrode on the polymer coating.

According to one embodiment, the process according to the invention comprises an additional step vi) of continuously covering the coated metal wire with a counterelectrode. This operation for depositing an outer electrode may advantageously be performed in-line following the drying and annealing steps described previously, before the winding step.

The process according to the invention also comprises a step vii) of biasing the piezoelectric polymer deposited on the surface of the metal core. This biasing may be done in several ways, either before or after the deposition of the outer electrode.

The invention also relates to a composite piezoelectric fiber comprising an electroactive fluoropolymer shell which adheres to a metal core. Advantageously, the fiber according to the invention has an elastic deformation of between 1% and 5%.

Another subject of the invention relates to the use of the composite piezoelectric fiber in various applications such as instrumented composite materials, the manufacture of technical textiles, the manufacture of textile articles, the filtration of fluids, and in electronics.

The present invention makes it possible to overcome the drawbacks of the prior art. In particular, the invention provides a fluoropolymer-based coating formulation which makes it possible to obtain optimum adhesion on a bare electrically conductive metal filament, without requiring prior enameling or cladding for attachment. This coating formulation is used by means of a simple solvent-based process for the continuous manufacture of filament coating with a piezoelectric polymer. This process is readily industrializable and does not require modification of the properties for the wetting of the surface of the bare metal wire by application of an electrical voltage (electrowetting).

FIGURES

FIG. 1 shows the scanning electron microscopy images on copper filaments 700 μm in diameter, coated with a layer of formulation based on 20% P(VDF-TrFE) copolymer in MEK. Images b and d relate to fibers according to the invention, the coating layers of which contain a surfactant (1%) and an adhesion promoter (0.25%). Images a and c relate to comparative fibers, the coating layers of which are free of surfactant and of adhesion promoter. Image 1c is a magnification of image 1a. Image 1d is a magnification of image 1b.

FIG. 2 shows six biasing curves obtained by gradually increasing the electric field at the terminals of the piezoelectric fiber. The ferroelectric effect is clearly demonstrated via the hysteresis phenomenon and the increase in zero-field permanent biasing. These curves were obtained by varying the electric field at a frequency of 1 Hz.

FIG. 3 shows the bias curve in μC/cm$^2$ obtained for maximum electric field values of +86 MV/m and −86 MV/m with scanning at 1 Hz. This figure also shows the curve for the current (in µA) obtained during this biasing. The current peaks correspond to the values of the coercive field, which is the field required for alignment of the electric dipoles, additional proof of the ferroelectric and piezoelectric behavior obtained.

FIG. 4 is a scheme illustrating the one-step DC biasing with coating of the piezoactive polymer and of the counter-electrode.

DESCRIPTION OF EMBODIMENTS OF THE INVENTION

The invention is now described in greater detail and in a nonlimiting manner in the description that follows.

According to a first aspect, the invention relates to a coating formulation comprising the following components:
 a) a P(VDF-TrFE) copolymer solution at 10-30% by mass in a volatile solvent,
 b) a surfactant, and
 c) an adhesion promoter.

According to various embodiments, said formulation comprises the following features, combined where appropriate.

Fluoro Copolymer

The fluoro copolymer of formula P(VDF-TrFE) consists of units derived from vinylidene fluoride and of units derived from trifluoroethylene. The proportion of units derived from TrFE is preferably from 5 mol % to 95 mol %, relative to the sum of the units derived from VDF and TrFE, and notably: from 5 mol % to 10 mol %; or from 10 to 15 mol %; or from 15 to 20 mol %; or from 20 to 25 mol %; or from 25 to 30 mol %; or from 30 to 35 mol %; or from 35 to 40 mol %; or from 40 to 45 mol %; or from 45 to 50 mol %; or from 50 to 55 mol %; or from 55 to 60 mol %; 10 or from 60 to 65 mol %; or from 65 to 70 mol %; or from 70 to 75 mol %; or from 75 to 80 mol %; or from 80 to 85 mol %; or from 85 to 90 mol %; or from 90 to 95 mol %.

A range from 15 to 55 mol % is particularly preferred.

The molar composition of the units in the P(VDF-TrFE) copolymer may be determined by various means such as infrared spectroscopy or RAMAN spectroscopy. Conventional methods of elemental analysis of carbon, fluorine and chlorine or bromine or iodine elements, such as X-ray fluorescence spectroscopy, make it possible to calculate the mass composition of the polymers, from which the molar composition is deduced. Use may also be made of multinuclear, notably proton ($^1$H) and fluorine ($^{19}$F), NMR techniques, by analysis of a solution of the polymer in a suitable deuterated solvent.

The P(VDF-TrFE) copolymer is preferably random and linear. It may be homogeneous or heterogeneous. A homogeneous polymer has a uniform chain structure, the random distribution of the units derived from the various monomers barely changing between the chains. In a heterogeneous polymer, the chains have a distribution of units derived from the various monomers of multimodal or spread-out type. A heterogeneous polymer thus comprises chains that are richer in a given unit and chains that are poorer in this unit.

The Curie temperature of the copolymer is between 50° C. and 145° C. The Curie temperature of the polymers of the invention may be measured by differential scanning calorimetry or by dielectric spectroscopy.

The copolymers of the invention may be produced by using any known process, such as emulsion polymerization, microemulsion polymerization, suspension polymerization and solution polymerization.

According to one embodiment, the weight-average molar mass, which in the context of this patent application is also referred to as the "molecular weight" (Mw) of the copolymer, ranges from 200 000 g/mol to 1 500 000 g/mol, preferably from 250 000 g/mol to 1 000 000 g/mol and more particularly from 300 000 g/mol to 700 000 g/mol.

The latter can be adjusted by modifying certain parameters of the process, such as the temperature in the reactor, or by adding a transfer agent.

The molecular weight distribution can be estimated by SEC (size exclusion chromatography) with dimethylformamide (DMF) as eluent, with a set of three columns of increasing porosity. The stationary phase is a styrene-DVB gel. The detection process is based on measurement of the refractive index, and calibration is performed with polystyrene standards. The sample is dissolved at 0.5 g/l in DMF and filtered through a 0.45 µm nylon filter.

The molecular weight can also be evaluated by measurement of the melt flow index at 230° C. under a load of 5 kg according to ASTM D1238 (ISO 1133).

Moreover, the molecular weight can also be characterized by measurement of the viscosity in solution according to the standard ISO 1628. Methyl ethyl ketone (MEK) is a preferred solvent for determining the viscosity index.

In the coating formulation, the P(VDF-TrFE) copolymer is dissolved at 10-30% by mass in a volatile solvent.

According to one embodiment, said volatile solvent is chosen from the following list:
 ketones, notably methyl isobutyl ketone, methyl ethyl ketone (MEK), cyclopentanone and acetone,
 esters, notably ethyl acetate, methyl acetate, propyl acetate, butyl acetate and propylene glycol methyl ether acetate,
 amides such as dimethylformamide and dimethylacetamide,
 dimethyl sulfoxide,
 furans, notably tetrahydrofuran,
 carbonates, notably dimethyl carbonate,
 phosphates, notably triethyl phosphate,
 and mixtures thereof.

According to one embodiment, said volatile solvent is chosen from the following group: methyl ethyl ketone, cyclopentanone, acetone, ethyl acetate.

Surfactant

The surfactant ensures optimum wetting of the solution of fluoro copolymer on the metal core. According to one embodiment, said surfactant is of the nonionic type.

According to one embodiment, said surfactant is based on an acrylic copolymer (for example BYK 3440) or based on high molecular weight block acrylic copolymers (for example Disperbyk 163).

The content of surfactant ranges from 0.05% to 1% by weight and preferably from 0.1% to 0.5% by weight, limits inclusive, relative to the weight of the coating formulation.

Adhesion Promoter

The adhesion promoter contributes toward improving the wetting of the solution of fluoro copolymer on the metal core, and also makes it possible to obtain an adhesive coating of copolymer on the filament. It is a polymer functionalized with groups such as —$NH_2$, —OH, —COOH or other associative groups.

According to one embodiment, said adhesion promoter comprises functional copolymers of hydroxyl type with acid groups (for example BYK 4510) or binders of ethoxysilane type, for example 3-aminopropyltriethoxysilane (Dynasylan AMEO).

The mass content of adhesion promoter in the coating formulation is between 0.05% and 3%, preferably between 0.2% and 0.5%, limits inclusive, relative to the weight of the coating formulation.

According to one embodiment, the viscosity of the coating formulation is between 1 and 500 Pa·s and preferably between 10 and 100 Pa·s, for a shear rate of 10 s$^{-1}$. The use of a coating solution which shows shear-thickening behavior is advantageous. The viscosity is measured at ambient temperature between 2° and 25° C. using a Brookfield viscometer according to the standard ASTM D2983.

According to one embodiment, the coating formulation according to the invention consists of these three components a, b and c.

The invention also relates to a solvent-based process for the continuous manufacture of a composite piezoelectric fiber comprising a metal filament covered with a layer of piezoelectric fluoropolymer, said process comprising the following steps:
  i) providing a bare metal wire,
  ii) coating said metal wire with the coating formulation according to the invention, comprising the passage of said metal wire through a coating nozzle where said coating formulation is injected, to obtain a coated metal wire,
  iii) drying said coated metal wire to evaporate the solvent,
  iv) heating the dried coated metal film to achieve thermal annealing.

The process begins by the unwinding of a bare metal wire. The metal must preferably have an electrical conductivity of greater than 0.5 MS/m and is chosen from the following list: copper, platinum, stainless steel, molybdenum. The metal wire has a diameter ranging from 50 to 900 μm, preferably from 80 to 300 μm and has a Young's modulus of greater than 1 GPa and also an elastic elongation of between 1% and 10%.

Advantageously, the metal wire is degreased in a tank using an alkaline, acidic or detergent solution or with alcohol. The degreased wire is subsequently dried, and then passed through a coating nozzle in which the wire is covered with a thin layer of the coating formulation according to the invention, described above.

Preferentially, the process is performed vertically to allow optimum centering of the coating formulation on the filament. The injection rate is adapted as a function of the coated filament diameter, the diameter of the hollow tube, the outlet diameter of the coating nozzle, the viscosity of the injected solution and the throughput speed of the filament.

Several successive passages through the coating head make it possible to adjust the thickness of the coating formulation to the surface of the filament.

The thickness of piezoelectric polymer obtained via the solvent-based coating process described herein is between 5 and 100 μm and preferably between 10 and 30 μm.

The viscosity of the coating solution making it possible to obtain this thickness is ideally between 1 and 500 Pa·s for a shear rate of 10 s$^{-1}$. The use of a coating solution having a viscosity of between 10 and 100 Pa·s or showing shear-thickening behavior is advantageous for obtaining an adhered polymer coat of controlled thickness centered on the metal core.

Adapting the rheology of the coating formulation solution makes it possible to optimize the thickness of the polymer layer on the metal filament and the uniformity of this layer and to prevent the formation of porosities. This thickness ranges from 5 and 100 μm, and is preferably between 10 and 30 μm.

Drying Step

A drying method may consist in passing the coated filament through a tunnel of hot air blown at a temperature of between 50° C. and 150° C., making it possible to evaporate off the solvent used for the coating.

Annealing Step

Once the metal wire has been coated with the piezoelectric polymer layer, a step of thermal annealing makes it possible to homogenize the structure and to promote the adhesion and piezoelectric behavior properties. This annealing step preferably takes place at a temperature of between 80 and 200° C. for 10 minutes and advantageously between 13° and 180° C. for 5 minutes.

This annealing may also be performed in-line after drying the polymer layer, by evaporation of the solvent, and before the winding step, during a one-step procedure.

The process also comprises a step v) of winding the coated metal wire, which may be performed either before the thermal annealing step or after this step.

In the piezoelectric composite fiber comprising the metal wire and the fluoropolymer layer, the metal wire acts as the inner electrode. Various uses of this composite piezoelectric fiber require the deposition of an outer electrode on the polymer coating.

According to one embodiment, the process according to the invention comprises an additional step vi) of continuously covering the coated metal wire with a counterelectrode.

Deposition of the Outer Electrode

The filament of metal and P(VDF-TrFE) copolymer, prepared as described above, may be covered with a counterelectrode continuously, according to one of the routes indicated below:
  solvent-based coating with a solution of conductive polymer, for example a solution of PEDOT:PSS (PEDOT denotes poly(3,4-ethylenedioxythiophene) and PSS denotes poly(styrene sulfonate)), in a bath (immersion) or in a coating nozzle; or
  liquid-based coating using a conductive ink of silver lacquer or carbon varnish type (carbon or nanocarbon blacks), by immersion or in a coating nozzle; or
  melt-route coating with a CPC polymer; in this case, no drawing and no alignment of fillers, the conductivity is greater than 100 S/m; or
  metallization by evaporation of gold or of another conductive metal; or
  binding of a conductive metal wire around the piezoactive coat; or
  braiding of a metal wire around the piezoactive coat (cord, cable, etc.).

A particularly advantageous way for obtaining a conductive outer electrode deposited continuously on the piezoelectric polymer consists in using a film-forming PEDOT:PSS aqueous solution. This may be obtained, for example, by passing the wire to be covered through the conductive polymer solution mentioned, followed by drying it by evaporation before winding.

This operation for depositing an outer electrode may advantageously be performed in-line following the drying and annealing steps described previously, before the winding step.

The process according to the invention also comprises a step vii) of biasing the piezoelectric polymer deposited on the surface of the metal core.

Once the piezoelectric polymer has been deposited on the surface of the metal core, it is necessary to bias the fluorinated material under an electric field in order to obtain a macroscopic piezoelectric response from the device.

This biasing may be done in several ways, either before or after the deposition of the outer electrode.

DC Biasing without a Counterelectrode

This operation consists in applying an electric field between the surface of the adhered polymer layer and the central metal core. To do this, two methods are conventionally employed by a person skilled in the art: direct-contact biasing and contactless biasing.

According to one embodiment, the DC biasing is with direct contact and comprises the following steps:
  connecting the bare conductive wire to a zero potential (ground-earth) either by earthing the metal wire reel, or by a contact roller system which is itself earthed;
  coating the piezoactive polymer by covering the wire with a polymer solution followed by evaporation of the solvent described previously; and
  passing the coated wire over a system of electrically conductive rollers, maintained at high electric potential so that the electric field at the terminals of the polymer cladding is between 20 and 200 MV/m.

According to another embodiment, the DC biasing is contactless and uses the corona effect. Efficient biasing of the fluoropolymers of the present invention is achieved at high electric field values of the order of 100 V/µm. However, the maximum electric field that may be applied in air before breakdown is about 3 V/µm. Beyond this value, discharge is observed by ionization of the air between the two poles, subjected to a high potential difference, with creation of an atmospheric plasma and evolution of ozone. It is this mechanism which is used in the corona biasing method.

A device for the DC biasing of a fiber is described in WO 2014/161920, in which a corona tunnel serves as the outer electrode. This corona tunnel consists of a number of conductive needles subjected to a high electric potential. The conductive core of the piezoelectric fiber is itself earthed. The distance between the needle electrodes and the fluorinated surface of the fiber is kept constant, and an electric field of greater than 3 V/µm is applied between the two electric poles of the system. An electric discharge by ionization of the air between the needle and the fluorinated surface is obtained. The fluorinated surface then becomes charged to a high potential due to the effect of this discharge, which thus contributes toward locally biasing the polymer to fields considerably greater than 3 V/µm.

According to one embodiment, a field/plasma diffuser is inserted between the corona needle and the surface to be biased; it is a conductive metal grate. This grate acts as a diffuser of the excessively localized electric field generated by the corona needles, and makes it possible to obtain more homogeneous biasing on the surface facing the electrode.

DC Biasing with a Counterelectrode

A counterelectrode was deposited in DC mode as described above.

According to one embodiment, the in-line biasing comprises the following steps:
  connecting the bare conductive wire to a zero potential (ground-earth) either by earthing the metal wire reel, or by a contact roller system which is itself earthed;
  coating the piezoactive polymer by covering the wire with a polymer solution followed by evaporation of the solvent described previously;
  depositing the counterelectrode; and
  passing the coated wire over a system of electrically conductive rollers, maintained at high electric potential so that the electric field at the terminals of the polymer cladding is between 20 and 200 MV/m.

According to another embodiment, the biasing is performed in one step on conclusion of the in-line deposition of the counterelectrode.

This embodiment is illustrated in the scheme of FIG. 4.

The invention also relates to a composite piezoelectric fiber comprising an electroactive fluoropolymer shell which adheres to a metal core. Advantageously, the fiber according to the invention has an elastic deformation of between 1% and 5%. The fluoropolymer layer is biased and can be covered with an outer electrode made of metal or conductive polymer.

Another subject of the invention relates to the use of the composite piezoelectric fiber in various applications such as the manufacture of technical textiles, the filtration of fluids, and in electronics.

A fiber according to the invention composed of a fluoropolymer and having a conductive core, constituting a first electrode, and a conductive outer cladding constituting a second electrode may thus constitute an actuator. The application of an electric field between these electrodes makes it possible to modify the mechanical properties of the fiber. If this fiber is incorporated into a textile structure, the application of this electric field makes it possible to modify the mechanical properties of this textile structure.

A subject of the invention is also a piezoelectric device comprising the piezoelectric fiber according to the invention.

The invention is also directed toward textile materials which comprise the piezoelectric fiber described.

EXAMPLES

The examples that follow illustrate the invention without limiting it.

Example 1. Manufacture of Fibers Illustrating the SEM Images of FIG. 1

A concentrated solution containing 20 w % of VDF-TrFE (80/20) copolymer in MEK is obtained by dissolution without heating. 1% of Disperbyk 3440 and 0.2% of DynaSylan Ameo adhesion promoter (triethoxysilane) are added to this solution without heating.

This solution is used for the DC coating of a copper filament 700 µm in diameter, followed by a step of drying at 80° C. and then in-line annealing at 135° C. in two separate ovens. The fiber is finally wound.

The optimized formulation and the solvent-based coating process make it possible to obtain bare copper filaments adhesively coated with the copolymer without the use of insulating enameling or a wetting process by applying an electric field.

Example 2: Manufacture of a Piezoelectric Fiber Device with a Metal Core

A piezoelectric fiber is manufactured according to the invention. It consists of: a copper filament 200 µm in diameter, constituting the inner electrode; a layer of 20 µm of a P(VDF-TrFE) copolymer containing 20 mol % of TrFE, which adheres to the filament; and a layer of conductive carbon varnish deposited manually onto the surface of the fluoropolymer, constituting the outer electrode.

The device is electrically connected, the electrical contacts are provided by means of compatible high-voltage pins or flat crocodile clips. One pin is connected to the metal core and earthed, and the other pin is placed in contact with the outer electrode subjected to a variable potential.

The area facing the two electrodes is expressed by the equation:

$$S=\pi\phi L$$

where: f is the diameter of the metal core and L is the distance between the electrodes When L=5 cm, this gives: $S=\pi \times 200 \times 10^{-6} \times 5 \times 10^{-2} = 31.42$ mm$^2$.

This device is then biased "off-line" with the application of an increasing sinusoidal voltage with a frequency of 1 Hz, up to 100 MV/m, i.e. 2000 V for the sample 20 μm thick. During the biasing, the electric field and current values are recorded.

The ferroelectric effect is clearly demonstrated via the hysteresis phenomenon and the increase in zero-field permanent biasing (see FIG. 2). The current peaks measured correspond to the values of the coercive field, which is the field required for alignment of the electric dipoles, indicating that ferroelectric and piezoelectric behavior are obtained (FIG. 3).

These devices may also be subjected to cyclical mechanical stresses (DMA, traction, bending, etc.).

The invention claimed is:

1. A polymer formulation configured for coating a metal core to form a composite piezoelectric fiber, the polymer formulation comprising components:
   a solution of 10-30% by mass of a poly(vinylidene fluoride-trifluoroethylene) P(VDF-TrFE) copolymer in a volatile solvent;
   a nonionic surfactant having a mass content of from 0.05% to 1% by weight, relative to a weight of the polymer formulation; and
   an adhesion promoter having a mass content of 3% or less relative to the weight of the polymer formulation,
   wherein the polymer formulation, formed by combining the solution, the nonionic surfactant, and the adhesion promoter, has a viscosity of between 1 and 500 Pa·s, for a shear rate of 10 s$^{-1}$.

2. The polymer formulation as claimed in claim 1, wherein the P(VDF-TrFE) copolymer consists of units derived from VDF and from TrFE, a proportion of units derived from TrFE ranging from 5 mol % to 95 mol % relative to a sum of the units derived from VDF and from TrFE.

3. The polymer formulation as claimed in claim 1, wherein said volatile solvent is chosen from ketones, esters, amides, dimethyl sulfoxide, furans, carbonates, phosphates, and mixtures thereof.

4. The polymer formulation as claimed in claim 1, wherein the nonionic surfactant is based on an acrylic copolymer.

5. The polymer formulation as claimed in claim 1, wherein said adhesion promoter is chosen from functional copolymers of hydroxyl type with acid groups or binders of ethoxysilane type, wherein the adhesion promoter mass content is between 0.05% and 3% relative to the weight of the polymer formulation.

6. The polymer formulation as claimed in claim 1, the polymer formulation consisting of components:
   the solution of 10-30% by mass of a poly(vinylidene fluoride-trifluoroethylene) P(VDF-TrFE) copolymer in a volatile solvent;
   the nonionic surfactant having a mass content of from 0.05% to 1% by weight, relative to a weight of the polymer formulation; and
   the adhesion promoter having a mass content of 3% or less relative to the weight of the polymer formulation.

7. The polymer formulation as claimed in claim 1, wherein the non-ionic surfactant is a copolymer based on high molecular weight block copolymers.

8. The polymer formulation as claimed in claim 1, wherein the non-ionic surfactant mass content is from 0.1% to 0.5%, relative to the weight of the polymer formulation.

9. The polymer formulation as claimed in claim 1, wherein the adhesion promoter mass content is between 0.05% and 3%, relative to the weight of the polymer formulation.

* * * * *